United States Patent [19]

Gordon

[11] Patent Number: 4,477,777

[45] Date of Patent: Oct. 16, 1984

[54] ANALYSIS OF BIOLOGICAL MATERIAL

[75] Inventor: Roy E. Gordon, Oxford, England

[73] Assignee: Oxford Research Systems Limited, England

[21] Appl. No.: 389,064

[22] Filed: Jun. 16, 1982

[30] Foreign Application Priority Data

Jun. 19, 1981 [GB] United Kingdom ............... 8118949

[51] Int. Cl.$^3$ ............................................. G01R 33/08
[52] U.S. Cl. ..................................... 324/300; 324/307
[58] Field of Search ...................... 324/300, 307, 309

[56] References Cited

FOREIGN PATENT DOCUMENTS 2103062 8/1971 Fed. Rep. of Germany ...... 324/300

OTHER PUBLICATIONS

Peter Styles et al., Simultaneous Multinuclear NMR by Alternate Scan Recording of 31P and 13C Spectra, Journal of Magnetic Resonance 35, 329-336, (1979).
Gregory et al., Application of Wide-Line NMR to Analysis of Mineral Products and Fats and Oils, Journal of the American Oil Chemists Society, pp. 775-777, Sep. 1968.
W. Moniz, Carbon-13 Fourier Transform NMR-an Important New Analysis Tool, Report of NRL Progress, pp. 1-14, Aug. 1975.

Primary Examiner—Michael J. Tokar
Attorney, Agent, or Firm—Cushman, Darby & Cushman

[57] ABSTRACT

A method of determining or imaging fats in a non $^{13}C$ enriched biological sample, particularly human tissue comprising subjecting the sample to a magnetic field, irradiating the sample with radiofrequency electromagnetic radiation, obtaining from the sample an electrical signal indicative of the radiofrequency absorption of the sample in the magnetic field at a frequency corresponding to the $^{13}C$ NMR resonance frequency for $-(CH_2)_n-$, filtering the signal to exclude components due to absorption by the sample attributable to carbon atoms other than those present as $-(CH_2)_n-$ and determining from the intensity of the absorption the fat content of the sample, or applying to the signal an imaging technique to determine the fat distribution in the sample. $^1H$ decoupling is preferably employed to increase signal-to-noise ratio.

The method is useful in the diagnosis of certain fat-related diseases, such as muscular dystrophy.

11 Claims, 3 Drawing Figures

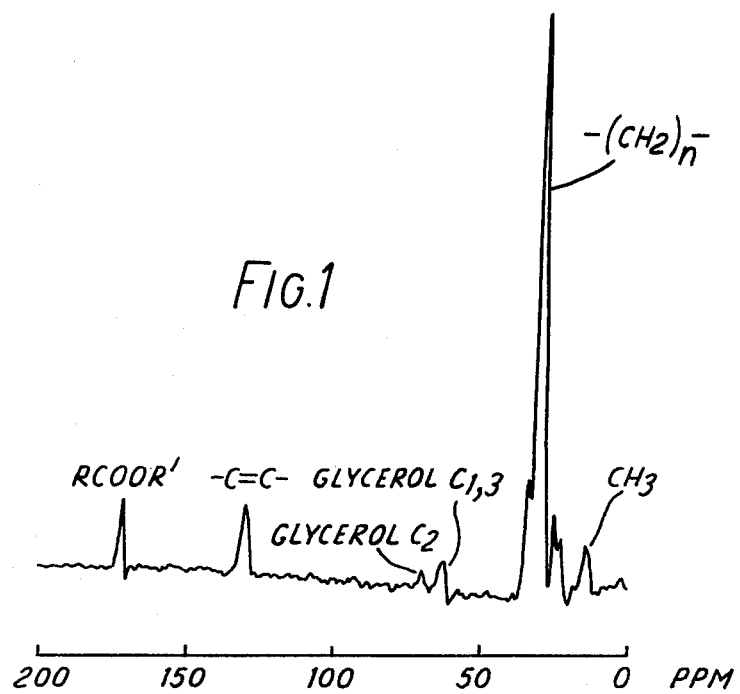
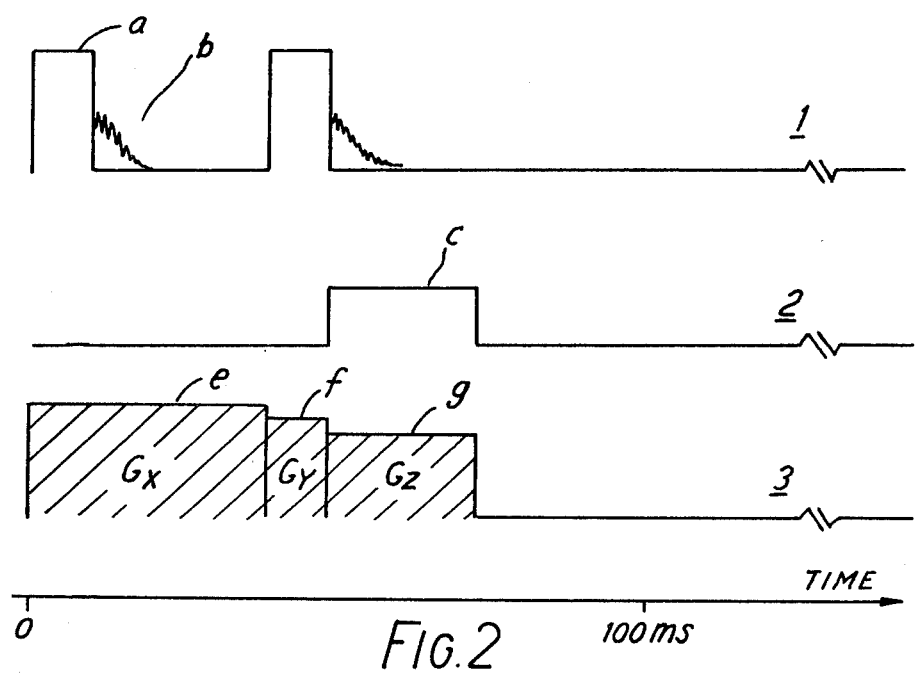

ANALYSIS OF BIOLOGICAL MATERIAL

Nuclear Magnetic Resonance (NMR) is based on the phenomenon that when a substance is subjected to a static magnetic field B and an oscillatory electromagnetic field of angular frequency $\omega$ then a condition of resonance occurs when $\omega = \gamma B$, where $\omega$ is the gyromagnetic ratio for a particular nucleus present in the substance. The resonance can be detected and is indicative of the presence of a particular element comprising that nucleus.

Where the material includes complex molecules the localised fields produced by molecular electrons have a screening effect which causes identical nuclei in different chemical or molecular environments to resonate at slightly different frequencies, that is to say the value of B is slightly modified for the same nucleus in different environments. This effect is known as the chemical shift. The magnitude of such shifts is very small but it can often be detected and can be used for distinguishing between different compounds containing the same element.

The nuclear magnetic resonance technique may be used only on nuclei which have a magnetic moment, and this places severe restriction on the circumstances in which the technique can be used. Examples of nuclei having magnetic moments are $^1H$, $^{31}P$ and $^{13}C$.

In recent times, great interest has been expressed in utilising nuclear magnetic resonance in conjunction with imaging techniques, to form a two or three dimensional representation of the distribution of particular materials in a sample. Various imaging techniques that use NMR have been proposed in which a specimen is subjected to non-homogeneous magnetic fields varying in time or space, for example by superimposing a time-varying magnitude field component or a linear magnetic field gradient on the main magnetic field, to induce localised resonances in parts of the specimen and thus enable an image to be built up based on the presence of a particular nucleus. Examples of such prior art proposals are the following techniques:

(1) Projection-reconstruction procedures, e.g. P. C. Lauterbur (Nature, 242, 190 (1973)), (2) Selective excitation methods, e.g:
  (i) Garroway A. N., Grannel P. K. and Mansfield P., J. Phys. C., 7, L457 (1974),
  (ii) Lauterbur P. C. Dulcey C. S., Lai C. M., Feiler M. A., House W. V., Kramer D. M., Chen C. N. and Dias R., Proc. XVIII Ampere Congress (eds. P. S. Allen, E. R. Andrew & C. A. Bates), Amsterdam: North Holland, P27 (1974),
  (iii) Hutchison J. M. S., Proc. 7th L. H. Gray Conf., Chichester: Wiley p135, (1976)), (3) Modifications of 2D Fourier Transform NMR techniques, e.g:
  (i) Kumar A., Welti D. and Ernst R. R., Naturwissenschaften 62, 34 (1975),
  (ii) Kumar A., Welti D. and Ernst R. R., J. Magn. Reson., 18, 69 (1975) and (4) Fonar techniques, e.g: Damadian R., Minkoff L., Goldsmith M., Stanford M. Koutcher J., Physiol. Chem. Phys., 8, 61 (1976).

A more complete list of imaging techniques useful in NMR may be found in Phil. Trans. Roy. Soc., B289 (1980).

It can be seen from the above references that imaging techniques are themselves very well known, and the present specification should be considered to incorporate by reference the disclosures of all of the above listed of documents.

The imaging techniques described above as applied in biology and medicine have hitherto been almost exclusively directed to the detection of resonance of the proton or $^1H$ nucleus. Biological material contains large amounts of hydrogen, substantially all of which is the isotope $^1H$, and thus the technique is relatively sensitive for protons. In order to successfully carry out an imaging experiment, it is desirable to be able to select from the NMR spectrum a single sharp peak which is widely spaced from any neighbouring peaks in comparison with the field gradient required to perform the imaging. The chemical shift for the proton is however only about 10 ppm (parts per million) and it is in practice only possible to obtain spatial resolution at the expense of spectral resolution. The resulting image therefore does not distinguish between $^1H$ in water and $^1H$ in fat when these substances are both present in the same biological tissue.

Of the other alternative nuclei mentioned above, both $^{31}P$ and $^{13}C$ occur only in very low concentrations in naturally occuring biological material.

The value of $\gamma$ for $^{31}P$ enables a lower frequency to be used for a given value of B than for the $^1H$ nucleus. Thus, although the chemical shift range of biological phosphates is about 40 ppm, which should be sufficient in a high enough magnetic field to enable an imaging experiment to be carried out on a particular metabolite containing $^{31}P$ to the exclusion of other metabolites which also contain this nucleus, because of the low concentration in biological material (typically less than 30 mM) of metabolites containing $^{31}P$, and because of "ghosting effects" and the relatively long relaxation times of the $^{31}P$ resonances, imaging experiments in living systems have been found to be impracticable.

$^{13}C$ suffers, prima facie, from similar disadvantages to $^{31}P$. Thus, although carbon is abundant in biological material, the $^{13}C$ isotope constitutes approximately only one per cent of the total carbon present. Furthermore, it is to be expected that, in common with spectra obtained from other solids, $^{13}C$ spectra obtained from biological material would exhibit broad peaks, and thus have a poor signal-to-noise ratio, inadequate for a succesful imaging experiment.

We have nevertheless found, much to our surprise, that a good $^{13}C$ NMR spectrum of biological material, for example living or recently dead animal tissue, particularly human tissue, can be obtained in a reasonable time. It has been found in particular that, in the $^{13}C$ NMR spectrum obtained from living tissue, the spectrum is dominated by a single peak, attributable to the carbon atom of the $-(CH_2)_n-$ in stored fat. This signal has been found to dominate the spectrum to such an extent that, by raising artificially the base line by means of filtering techniques, it is possible to reduce the spectrum to a single line, attributable to the $-(CH_2)_n-$ resonance of stored fats, and giving a measure of the fat content of the sample.

According to a first aspect of the invention, there is therefore provided a method of determining fats in a non $^{13}C$ enriched biological sample, which method comprises subjecting the sample to a magnetic field, irrdiating the sample with radiofrequency electromagnetic radiation, obtaining from the sample an electrical signal indicative of the radiofrequency absorption of the sample in the magnetic field at a frequency corresponding to the $^{13}$C NMR resonance frequency for the —(CH$_2$)$_n$— resonances, filtering the signal to exclude components due to absorption by the sample attributable to carbon atoms other than those present in —(CH$_2$)$_n$— groups, and using the intensity of the said signal to determine the presence of fats in the sample.

It has also been found that this signal attributable to —(CH$_2$)$_n$— is particularly useful as a basis for an imaging experiment to determine the fat distribution in a sample.

According to a second aspect of the invention, there is therefore provided a method of determining fat distribution in a non—$^{13}$C enriched biological sample, which method comprises subjecting the sample to a magnetic field, irradiating the sample with radiofrequency electromagnetic radiation, obtaining from the sample an electrical signal indicative of the radiofrequency absorption of the sample in the magnetic field at a frequency corresponding to the $^{13}$C NMR resonance frequency for the —(CH$_2$)$_n$— groups, and applying to the signal an imaging technique to determine the fat distribution in the sample.

By the term "biological sample" as used herein is means that the sample involved is living or recently dead animal tissue, for example human tissue.

Interaction of $^{13}$C nuclei with neighbouring protons causes some splitting of the peaks of the spectrum in the sample experiment. It is therefore preferred that the proton resonances are decoupled from the $^{13}$C spins, at least during signal acquisition. Proton decoupling is a well known technique in $^{13}$C NMR and can be achieved by irradiating the sample with a further radiofrequency magnetic field having a frequency corresponding to the resonance fequency of the protons. Application of such a field effectively averages the interactions to zero.

Although it is not intended that the invention should be limited by any theory of operation, it is believed that the reason for the surprising finding that high resolution spectra of the —(CH$_2$)$_n$— line are available is that, in biological material as defined above, fat molecules (triglycerides) are stored in fat cells as lipid droplets, and have sufficient mobility to produce narrow resonance lines.

Because certain diseases of the human body cause, or are accompanied by changes in the fat distribution in various organs, it is possible by determining fat distribution in various parts of the human body according to the above method to diagnose disease. According to a further aspect of the invention, there is therefore provided a method for the diagnosis of a disease, for example muscular dystrophy or cancer, which method comprises determining fat distribution in a patient by a method as described above.

According to yet a further aspect of the invention, there is provided apparatus for investigating the fat content of a biological sample, comprising means for generating a magnetic field, means for supporting a biological sample in the magnetic field, means for generating a radiofrequency electromagnetic field in the region of the sample support, having a fequency such as to induce $^{13}$C nuclear magnetic resonance in the sample, means for producing a spatial variation in the magnetic field or the electromagnetic field, and means for producing a signal indicative of the electromagnetic absorption of the sample at a frequency corresponding to the $^{13}$C nuclear magnetic resonance frequency for the —(CH$_2$)$_n$— group, and means for determining the variation in the said signal as a function of the said spatial variation, to determine the fat distribution in the sample.

A preferred embodiment of the invention will now be illustrated with reference to the accompanying drawings, in which:

FIG. 1 represents an NMR spectrum of $^{13}$C from a human forearm,

FIG. 2 is a block diagram showing the timing of radiofrequency pulses and field gradients used to produce the spectrum of FIG. 1.

Figure 3:
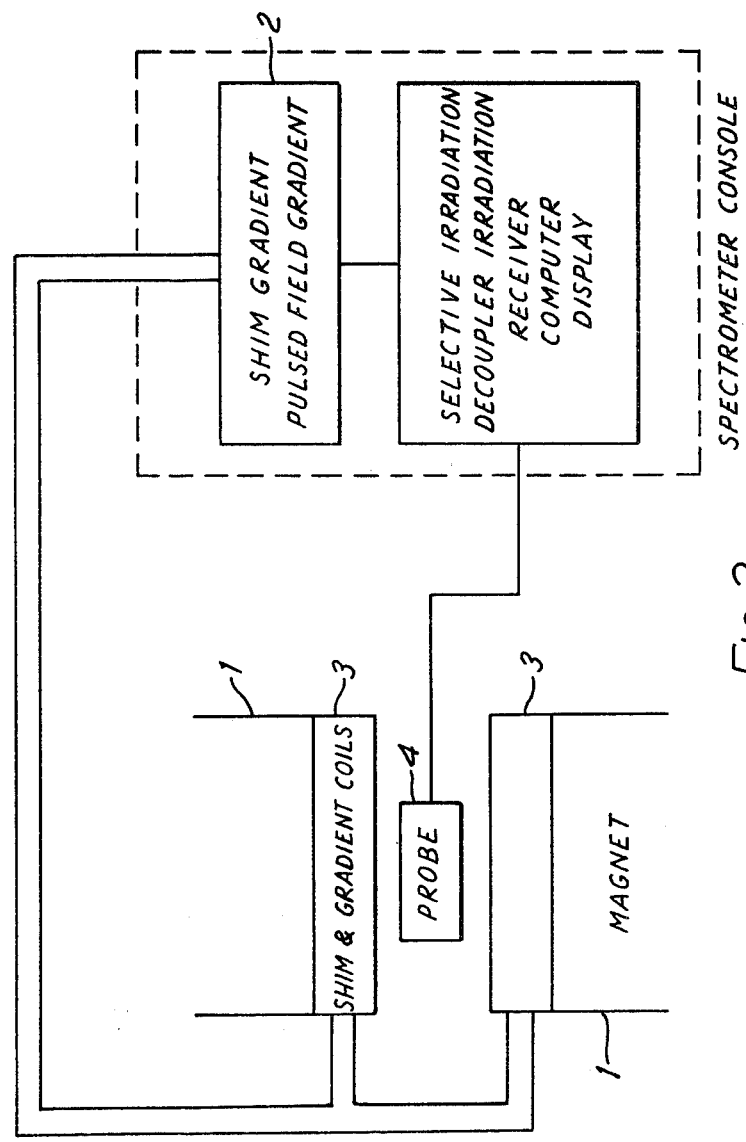
FIG. 3 is a schematic block diagram of apparatus according to the invention.

The spectrum of FIG. 1 was obtained in one minute with a magnetic field of 1.89 Tesla and an operating frequency of 20.2 MHz. The abscissa is in parts per million of the operating frequency and shows well separated lines with a spread of 200 ppm. The relaxation times are reasonably short (about 0.5 secs.). The different spectral lines represent different mobile portions of fat molecules.

The spectrum shown in FIG. 1 is so dominated by the —(CH$_2$)$_n$— peak that the other peaks can, for all practical imaging purposes, be neglected. Elimination of those peaks can be carried out by applying a threshold baseline correction to the spectrum using appropriate filtering means of known kind in the apparatus. For the example shown in FIG. 1, however, this baseline correction is not strictly necessary, and the fat molecules could be unambiguously imaged without such processing of the signal. Consequently the situation corresponds approximately to the situation encountered when imaging using $^1$H except that the sensitivity is very much lower.

The spectrum shown in FIG. 1 was obtained using a 4 cm diameter surface coil of the kind suggested by Ackermann et al (Nature 283, 167 (1980)) and was derived from approximately 25 ml of tissue of which approximately 3 ml consisted of subcutaneous and intra muscular fat (the signal-to-noise ratio (S/N) of the —(CH$_2$)$_n$—peak is about 50:1).

This can be used either as a measure of the fat content of the sample by integration or peak height measurement, or, in a preferred embodiment, the signal may be subjected to an imaging technique, preferably by spin echo techniques, to produce a 2 or 3 dimensional mapping of fat distribution in the sample.

In its simplest form the imaging technique involves the production of an image of a plane from a series of profiles taken along sequential line segments. Since the $^{13}$C sensitivity is much lower than that of $^1$H then in order to build up an image in a reasonable time the spatial resolution to some extent has to be sacrificed. If a minimum spatial resolution of 5 mm is sought then the volume of each element (5 mm ×5 mm ×5 mm) is 0.125 ml and would produce a maximum S/N of about 2:1 and therefore usable images can be produced in 10–15 minutes. Further improvements in acquisition time could be made either by increasing the size of the volume element (and therefore reducing spatial resolution) and/or using spin-echoes (e.g. echo planar method as described by P. Mansfield, A. A. Maudsley, & T. Baines (J. Phys. E., 9, 271 (1976), modified to include $^1$H-decoupling).

FIG. 2 is a block diagram illustrating schematically the tuning of the various field gradients and r.f. pulses in a version of one of the selective irradiation $^{13}$C imaging techniques described by Mansfield, Maudsley and Baines (above), modified to include an $^1$H-decoupling rf irradiation. Trace 1 shows the timing of the applied r.f.

pulses (a) at the $^{13}$C resonance frequency (20.2 MHz), and the subsequent decaying free induction decay signals (b), trace 2 shows the timing of the applied r.f. decoupling pulse (c) at the ($^1$H resonance frequency (80.3 MHz), and trace 3 shows the timing of the linear magnetic field gradient pulses $G_x$, $G_y$ and $G_z$ (e,f, and g respectively) applied via the gradient coils, all under computer control. The relative magnitudes of the gradients to be applied depend as is well known on the type of sample and the spatial resolution required, and the relative magnitudes in FIG. 2 should be considered as merely illustrative.

In the presence of the $G_x$ gradient the first selective irradiation leaves a slice of undisturbed spins in the YZ plane. Everywhere else the spins have been saturated. Successive columns of spins are now inspected by first of all irradiating with a selective pulse in the presence of the $G_y$ gradient to determine the particular column followed by acquiring the FID in the presence of the gradient $G_z$ and an $^1$H decoupling irradiation.

Subsequent Fourier transformation and processing of the free induction decay provides a signal which is indicative of the radiofrequency absorption of the sample in the magnetic field at a frequency corresponding to the $^{13}$C NMR resonance frequency for the $-(CH_2)_n13$ resonance. Because the measurement is made in the presence of a magnetic field gradient, a measure is provided of the dominant spin density distribution along the column. In the example cited previously this would be $(^{13}CH_2)_n$. The image of the plane is built up from successive spin density profiles.

The decoupling irradiation scheme can take any of the several known forms to make the most efficient use of the available decoupling power. The particular one illustrated in FIG. 2 is conventional noise modulated $^1$H rf irradiation during signal acquisition.

A block diagram of the apparatus required to carry out the experiment is shown in FIG. 3. A superconducting magnet or an electromagnet can be used to generate the $B_o$ magnetic field.

The apparatus shown includes a superconducting magnet 1 operating at 1.89 Tesla connected to suitable control means 2 for controlling the magnetic field gradient and homogeneity, for adjusting the homogeneity of the magnetic field. Common shim and gradient coils 3 are utilised for applying magnetic field correction and the desired magnetic field gradient in a conventional way.

The apparatus includes a sample support (not shown), which preferably includes means for supporting a human patient with a desired region of the body of the patient in the magnetic field.

A radiofrequency source operating at 20.2 MHz is coupled to a probe 4 in a conventional manner such that the approximate ratio of the main r.f. frequency to the field strength is 10.7 MHz/Tesla, i.e. the gyromagnetic ratio for $^{13}$C. A supplementary radiofrequency transmitter is also provided operating at the $^1$H frequency (approximately 80 MHz) to provide decoupling of the proton spins. Automatic control means are provided to pulse the radiofrequency fields and the field gradients in accordance with FIG. 2.

An advantage of measurements on the $^{13}$C nucleus is that the operating frequency is around a quarter of the frequency required for proton NMR measurement thus allowing a greater depth of penetration into a specimen. By the use of $^1$H-decoupling the $^1$H—$^{13}$C interactions are averaged to zero and it is possible to enhance the $^{13}$C sensitivity by up to six times. However care must be exercised when carrying out in-vivo measurements to avoid any harmful effects of heating induced by the higher frequency irradiation. The spatial range of this sensitivity enhancement may be limited by the depth of penetration of the oscillatory field at the $^1$H operating frequency. The technique as a whole is however reasonably safe to use in-vivo, particularly as compared with X-ray imaging techniques.

Since different organs and tissues contain different amounts of fat, imaging measurements based on the concentration of $^{13}$C provides the means of tissue characterisation. Since many organs, especially in the abdomen, are surrounded by fat, the signals from fat can be used to delineate the boundaries of these organs. In diseases that involve fatty degeneration, the $^{13}$C spectrum can provide an unambiguous monitor of the stages of the degeneration process. Tumors are known to contain very little fat compared with other tissue, so that the method allows for the investigation of cancer.

It will of course be appreciated that the invention is not limited to the foregoing specific disclosure, and the whole spectrum of imaging techniques may be applied in conjunction with the method of the invention in order to produce the desired image.

I claim:

1. A method of determining fats in a non $^{13}$C enriched biological sample, which methods comprises subjecting the sample to a magnetic field, irradiating the sample with radiofrequency electromagnetic radiation, obtaining from the sample an electrical signal indicative of the radiofrequency absorption of the sample in the magnetic field at a frequency corresponding to the $^{13}$C NMR resonance frequency for the $-(CH_2)_n-$ resonance, filtering the signal to exclude components due to absorption by the sample attributable to carbon atoms other than those present as the $-(CH_2)_n-$ groups and determining from the intensity of the absorption the fat content of the sample.

2. A method of determining fat distribution in a non—$^{13}$C enriched biological sample, which method comprises subjecting the sample to a magnetic field, irradiating the sample with radiofrequency electromagnetic radiation, obtaining from the sample an electrical signal indicative of the radiofrequency absorption of the sample in the magnetic field at a frequency for the $-(CH_2)_n-$ resonance, and determining from the signal the distribution in the sample of regions having an increased content of $-(CH_2)_n-$ groups, and thus the fat distribution in the sample.

3. A method as claimed in claim 2, and including the step of filtering the signal to exclude components due to absorption by the sample attributable to carbon atoms other than those present as $-(CH_2)_n-$.

4. A method as claimed in claim 2, wherein the sample is irradiated with radiofrequency radiation such as to decouple the spins due to $^1$H.

5. A method as claimed in claim 2, wherein the biological sample is living tissue.

6. A method for the diagnosis of a disease, which method comprises determining fat distribution in a patient by a method as claimed in claim 2.

7. A method as claimed in claim 5, wherein the disease is muscular dystrophy.

8. Apparatus for investigating the fat content of a biological sample, comprising means for generating a magnetic field, means for supporting a biological sample in the magnetic field, means for generating a radiofrequency electromagnetic field in the region of the sample support, having a frequency such as to induce $^{13}$C nuclear magnetic resonance in the sample, means for producing a spatial variation in the magnetic field or the electromagnetic field, and means for producing a signal indicative of the electromagnetic absorption of the sample at a frequency corresponding to the $^{13}$C nuclear magnetic resonance frequency for the $-(CH_2)_n-$ resonance, and means for determining the variation in the said signal as a function of the said spatial variation, to determine the fat distribution in the sample.

9. A method as claimed in claim 8, including a filter for excluding components of the signal due to absorption by the sample attributable to carbon atoms other than those present as $-(CH_2)_n-$.

10. Apparatus as claimed in claim 8, and including means for decoupling $^1$H nuclei present in the sample from the $^{13}$C nuclei.

11. Apparatus as claimed in claim 8, including means for supporting a human patient with a portion of the body of the patient in the said magnetic and electromagnetic fields.

* * * * *